United States Patent [19]

Kowalski

[11] Patent Number: 5,444,412

[45] Date of Patent: Aug. 22, 1995

[54] PROGRAMMING VOLTAGE REGULATION CIRCUIT FOR PROGRAMMABLE MEMORIES

[75] Inventor: Jacek Kowalski, Trets, France

[73] Assignee: Gemplus Card International, Gemenos, France

[21] Appl. No.: 196,160

[22] PCT Filed: Aug. 31, 1992

[86] PCT No.: PCT/FR92/00833

§ 371 Date: Feb. 22, 1994

§ 102(e) Date: Feb. 22, 1994

[87] PCT Pub. No.: WO93/05513

PCT Pub. Date: Mar. 18, 1993

[30] Foreign Application Priority Data

Sep. 5, 1991 [FR] France ................. 91 11008

[51] Int. Cl.[6] .............................................. H03L 5/00
[52] U.S. Cl. ................................. 327/541; 327/540; 327/543; 365/226; 365/227; 365/189.07; 365/189.09
[58] Field of Search ........... 365/227, 226, 185, 189.06, 365/189.07, 189.09, 900; 307/482, 296.1, 296.3, 296.6; 327/540, 541, 543

[56] References Cited

U.S. PATENT DOCUMENTS

| | | | |
|---|---|---|---|
| 4,533,846 | 8/1985 | Simko | 307/550 |
| 4,952,821 | 8/1990 | Kokubun | 307/350 |
| 5,168,174 | 12/1992 | Naso et al. | 307/296.6 |
| 5,175,706 | 12/1992 | Edme | 365/226 |
| 5,291,446 | 3/1994 | Van Buskirk et al. | 365/189.09 |

FOREIGN PATENT DOCUMENTS 60-225918  11/1985  Japan.
61-95561   5/1986   Japan.

Primary Examiner—Joseph A. Popek
Assistant Examiner—Andrew Q. Tran
Attorney, Agent, or Firm—Nilles & Nilles

[57] ABSTRACT

A circuit to produce a voltage Vpp from a lower voltage supply Vcc is useful, for example, to produce the voltage for programming the cells of an electrically programmable memory. The circuit has a load pump (PMP), a regulator (REG) to interrupt the working of the load pump when the voltage Vpp exceeds a predetermined voltage (Vpp0), a transistor (T1) to interrupt the current consumption of the regulator when the load pump is interrupted, and a control circuit (CTRL) to then monitor the voltage Vpp and ascertain that it does not drop by more than a small value dV below Vpp0 and to restart both the load pump and the current supply of the regulator if the voltage drops more than dV.

6 Claims, 2 Drawing Sheets

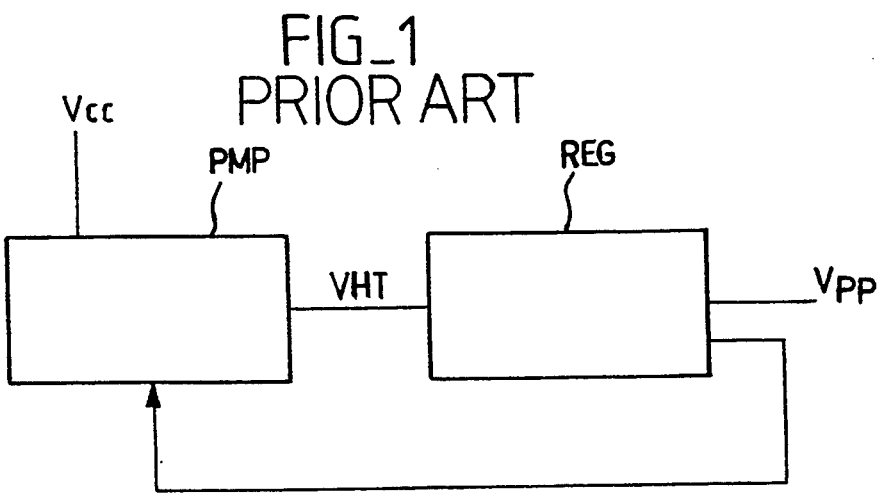
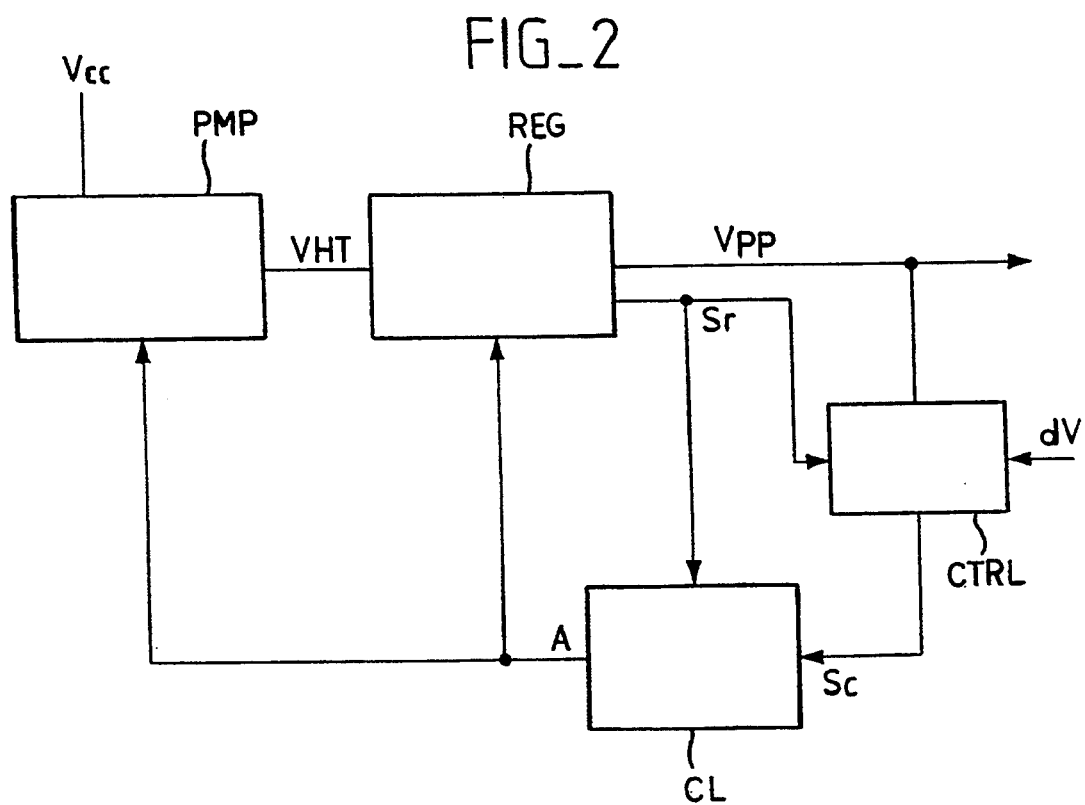

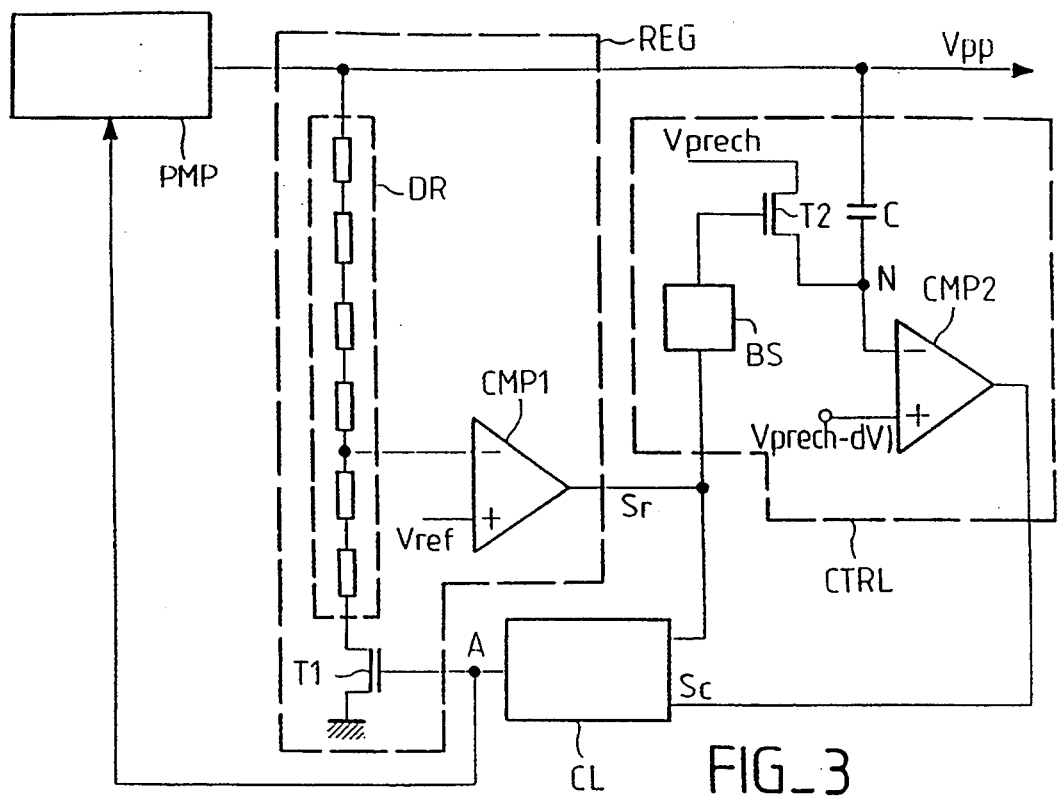
FIG_3
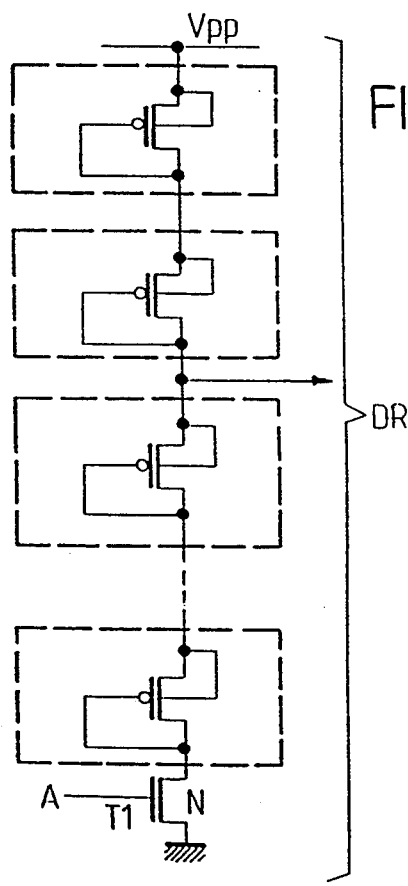
FIG_4
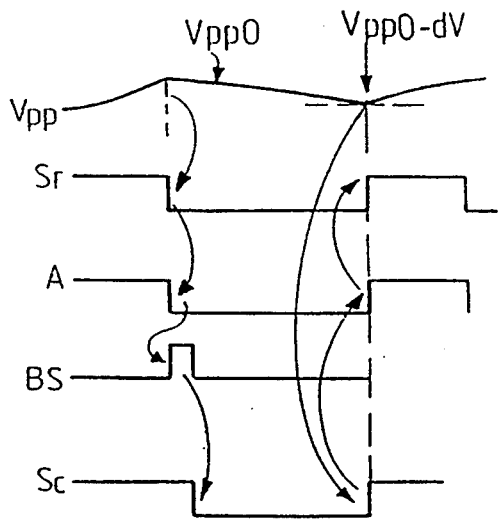
FIG_5

PROGRAMMING VOLTAGE REGULATION CIRCUIT FOR PROGRAMMABLE MEMORIES

The invention relates to electrically programmable memories in integrated circuit form, generally known as "EEPROM memories" or "EPROM memories" depending on whether or not they are electrically erasable, or again "flash EPROM" memories when they are erasable in blocks.

To program these memories, it is generally necessary to have a voltage known as the "programming voltage" Vpp available in the integrated circuit. This programming voltage is substantially higher than the normal supply voltage Vcc of the circuit. For example, Vcc is usually equal to 5 volts and Vpp is 15 volts or more.

In certain memories, the programming voltage Vpp is given by an external supply. However, this necessitates a specific additional supply terminal for the integrated circuit. The additional terminals add to the cost of the integrated circuit, and it is preferable to avoid them. In certain applications, in any case, the number of terminals is laid down (for example: chip cards with six or eight terminals) and there is no was to add another one. In other applications, there may even be no external supply terminals (for example, a chip card without contact whose operating power is provided by an electromagnetic means).

This is why integrated memories are proposed in which the programming voltage Vpp is produced right inside the integrated circuit, from the normal supply voltage Vcc. To this end, the circuit used is one that is conventionally called a load pump or voltage raiser that receives Vcc and sets up a voltage Vpp greater than Vcc.

The raising circuits are standard ones: a basic raising stage uses simply switches, two capacitors and a two-phase clock to actuate the switches. In a first step, the first capacitor is charged to 5 volts, and then it is discharged into the second capacitor. Then a cycle starts again: a first step of charging the first capacitor to 5 volts and a second step of discharging it into the second capacitor (this time, the second capacitor is already partially charged); the voltage at the terminals of the second capacitor then increases at each clock stroke. Within a few two-phase clock strokes, a voltage that is thrice Vcc is reached in the second capacitor. With two stages, the voltage Vcc is multiplied by 4 within a few clock strokes etc.

The level of output voltage from the raising circuit, available at a capacitor, is kept at a fixed value by a regulator. This regulator may be constituted by a line of transistors that are mounted as diodes so that each one sets up a voltage equal to its threshold voltage between its source and its drain. Depending on the technology implemented, the threshold voltage varies and the number of series-connected transistors generates the regulated voltage at output of the regulator.

For example, with transistors having a threshold voltage on the order of one volt, 16 transistors are needed to set up a regulated voltage Vpp on the order of 16 volts.

A major drawback of existing circuits is their consumption of substantial levels of current, due to the consumption by the load pump itself as well as to that of the regulator. Now it is generally desired to lower this consumption. Furthermore, in certain cases, it is absolutely indispensable to find approaches that minimize consumption: for example, in the case of integrated circuits for "contact-free" chip cards.

It is an aim of the invention to propose a circuit for the generation of programming voltage Vpp that consumes less than the prior art circuits and that furthermore has a good price/quality ratio, with regard to the reliability of operation and the space taken up by the circuit.

More generally, an aim of the invention is to propose a new circuit for the production of a regulated voltage, whether or not this is for a programmable memory.

According to the invention, the circuit for the generation of a voltage Vpp comprises a load pump, a regulation circuit capable of stopping the load pump when the voltage Vpp gets higher than a determined threshold, means to interrupt the current consumption of the regulation circuit when the voltage Vpp gets higher than a threshold (which is preferably the same as the foregoing threshold), and a control circuit capable of detecting a small drop in the voltage Vpp below the value given by the regulation circuit, and of reactivating the load pump and the current consumption of the regulation circuit when this drop exceeds a predetermined value dV.

In the prior art, the regulation circuit (or regulator) works continuously and consumes current continuously. Here, the regulator is put out of operation as soon as it detects the fact that the right value of programming voltage has been reached. And it is a control circuit, consuming very little current, that examines the stability of the voltage obtained. If the voltage drops excessively, it puts both the load pump and the regulator back into operation.

The control circuit is not equivalent to another regulator that would be similar to the first one. It may be built so as to consume very little current for its function is not to ascertain that the voltage conforms to a predetermined voltage (for example 15 volts) but to ascertain that the voltage obtained at a given moment (by means of the regulator) does not drop by more than a determined value dV (for example 0.5 volt).

The regulator will be built preferably from a resistive divider formed by numerous resistors of high value (of the order of one megohm each). These resistors may be made out of P channel transistors formed in respective N type wells, separated from one another (in the case of a P type substrate), these transistors having their drain and their gain joined. The source of each transistor is preferably connected to the corresponding well.

The regulator also has a voltage level detector (or comparator) to compare the voltage level at an intermediate point of the resistive divider with a reference. This detector has, for example, an input connected to one of the resistors and it may have another input receiving a reference voltage level. The output of this detector controls the load pump so as to be capable of interrupting its operation, and it also preferably controls a transistor for the supply of current to the resistive divider to interrupt the circulation of current in this divider. The assembly formed by the resistive divider and the current supply transistor is connected between the terminal of the regulator which gives the voltage Vpp and a ground.

The control circuit preferably has a capacitor connected between a floating node and a terminal of the regulator giving the voltage Vpp. The floating node may be precharged to a value Vprech, and it is connected to an input of a comparator which also receives, at another input, a reference voltage equal to VprechdV. The difference in potential dV defines (directly or indirectly) a value of voltage drop that is acceptable for the voltage Vpp. It is equal, for example, to some tenths of a volt. The output of this comparator is connected so as to control the reactivation of the load pump and the current supply of the divider.

Other features and advantages of the invention shall appear from the following description, made with reference to the appended drawings, of which:

FIG. 1 shows a block diagram of a prior art circuit;

FIG. 2 shows a block diagram of a circuit according to the invention;

FIG. 3 shows a detailed diagram of an embodiment of the invention;

FIG. 4 shows a detail of the regulator;

FIG. 5 shows a timing diagram of the signals of the circuit of FIG. 3.

The invention shall be described with reference to the production of a programming voltage for an electrically programmable memory, without its being necessarily assumed that this application restricts the scope of the invention.

FIG. 1 recalls the prior art constitution of a circuit for the generation of a programming voltage Vpp for an EPROM or an EEPROM when the voltage has to be produced inside the integrated circuit.

The integrated circuit is supplied with a voltage Vcc, equal for example to five volts. This voltage is used to obtain the operation of a voltage raising circuit PMP, often called a load pump because of its mode of operation. This load pump PMP produces a voltage VHT that is substantially higher than Vcc, for example between 15 and 20 volts.

The voltage VHT is applied to a regulator circuit REG that gives the programming voltage Vpp from the voltage VHT. The voltage Vpp may be equal to the voltage VHT. The main function of the regulation circuit REG is to compare the voltage Vpp with a reference value, give a signal for the interruption of the load pump when Vpp exceeds a given level and start it up again if Vpp falls below this threshold (possibly with a hysteresis).

The regulator most commonly used is a resistive divider bridge and it consumes current.

The diagram of the circuit according to the invention is shown in a general form in FIG. 2. There is still a load pump or voltage raising circuit PMP that has the same role as above and can be constituted as in the prior art.

The load pump gives a voltage VHT, available at an output capacitor of the load pump, that is again applied to a voltage regulator circuit REG. This circuit gives the desired voltage Vpp (which may be voltage VHT itself). It compares the voltage Vpp with a reference value and gives a signal Sr when the voltage Vpp exceeds this reference value. This signal Sr is used to interrupt the working of the load pump.

Compared with the regulator of FIG. 1, the regulator of FIG. 2 additionally possesses the following particular feature: it has a control input by which its current supply can be interrupted. This control input may receive a signal A that interrupts the current supply. Naturally, when the supply of the regulator is thus interrupted, it can no longer exert its function of regulation and no longer consumes any current, whether on Vcc or on Vpp.

The signal A is prepared from the signal Sr and sent out when the voltage Vpp has reached its reference value. It is this signal that is also used to interrupt the load pump.

The Vpp generation circuit furthermore comprises a control circuit CTRL having the following function: it receives the voltage Vpp, and it gives a signal Sc as soon as this voltage falls by more than a quantity dV below the initial value that it possesses subtantially when the working of the load pump is interrupted by the signal A.

This control circuit therefore does not compare the voltage Vpp with an absolute reference threshold, but it starts from the initial value Vpp0 of the voltage Vpp at a given instant, and it detects the drop by a value dV to give a signal when Vpp falls below Vpp0-dV. Preferably, Vpp0 is precisely the reference voltage reached by Vpp when the regulator sends the signal Sr to stop the load pump.

The signal Sc sent out by the control circuit is used to restore the current supply of the regulation circuit REG and to start up the load pump PMP again.

A logic circuit CL uses the signals Sr (coming from the regulator REG) and Sc (coming from the control circuit CTRL) to give the signal A which controls both the current supply of the regulator and the operation of the load pump. Sr prompts the setting up of the signal A; Sc prompts its interruption.

In other words, the signal A appears under the control of Sr to interrupt the current supply of the regulator and interrupt the load pump as soon as the regulator has detected the fact that Vpp has reached its reference value Vpp0. This signal A disappears under the control of Sc to restore the current supply of the regulator and start up the load pump again as soon as the control circuit has detected the passage of Vpp to below Vpp0-dV.

Thus, the regulator consumes current only when the voltage Vpp has to be raised by the load pump. And the necessity of raising this voltage is lessened precisely because the regulator no longer consumes any current on the conductor giving Vpp. Indeed, the fact is that the programming of memory cells by Vpp consumes very little current on Vpp. It is actually the regulator that consumes current and that makes Vpp drop in the prior art. This often makes it necessary to reactivate the load pump which, for its part, also consumes a great deal of current (on the Vcc supply).

The primary benefit of this original structure arises, therefore, when the control circuit CTRL consumes very little current. A description shall now be given of an exemplary practical embodiment that is appropriate, especially from this point of view.

FIG. 3 shows a detailed diagram of a preferred mode of execution of the invention.

The load pump PMP has not been described in detail because it may be a standard device. It has an oscillator, switches controlled in phase alternation by the oscillator, capacitors and possibly diodes. Its operation consists in switching over the capacitors alternately in parallel and then in series to make a charge flow, always in the same direction, from a first capacitor to a second capacitor. The charge gradually accumulates on the second capacitor. The signal A used to interrupt or start up the load pump will act quite simply by interrupting or permitting the operation of the oscillator.

The regulation circuit REG preferably has a resistive divider bridge DR connected between the voltage Vpp (here, Vpp is directly the voltage VHT coming from the load pump) and the ground. A switch constituted by a transistor T1 is, however, interposed between the divider and the ground. When this switch is on, it may be considered to be a short circuit (with very low resistance as compared with that of the resistive divider). When it is off, it interrupts the passage of current in the resistive divider. The divider then no longer consumes any current and no longer works properly. The gate of the transistor T1 receives the signal A mentioned with reference to FIG. 2.

The regulator REG also comprises a comparator CMP1 used as a detector of the level of the voltage Vpp. It has one input connected to an intermediate point of the resistive divider and another input connected to a reference voltage Vref. This comparator has the function of giving a signal Sr when the voltage at the intermediate point of the divider exceeds a voltage Vref. This then corresponds to the fact that the voltage Vpp applied to the end of the divider DR exceeds a reference value Vpp0. The choice of the intermediate point of the resistive divider makes it possible, with only one reference value Vref, to choose the reference value Vpp0. In an integrated circuit, it will be enough to modify a connection to choose the level Vpp0.

The resistors of the divider bridge DR preferably have a very high value (of the order of one megohm) to minimize the consumption of current when the regulator works. In a CMOS technology, each of the the resistors will preferably be constituted by an individual P channel transistor having its drain connected to the gate. Each transistor is placed in an individual N type well (different from that of the other resistors), this well being formed in a P type substrate. The source of the transistor is preferably connected to the well to reduce the effect of the variations in potential of the substrate on the threshold voltage of the transistors.

The value of these resistors is not very precise but what counts is their ratio which remains identical inasmuch as the transistors have identical or proportional dimensions.

FIG. 4 shows the assembly of the resistive divider bridge DR. The transistor T1, which is used to interrupt the current supply, is an N channel transistor. The separate wells are represented by dashed boxes around each transistor of the divider.

The signal Sr coming from the comparator CMP1 is applied to the logic circuit CL to participate in the preparing of the signal A. Furthermore, it is applied to the circuit CTRL so that this circuit starts working from the instant when the voltage Vpp has reached the desired value Vpp0.

More specifically, the signal Sr is applied to a monostable flip-flop circuit BS forming part of the control circuit CTRLo This flip-flop circuit sets up a short pulse through the triggering of the signal Sr. This short pulse precharges a floating node N at a fixed voltage Vprech. To this end, for example, the output of the flip-flop BS is applied to the gate of a transistor T2 which is connected between the floating node N and the precharging voltage Vprech. The node N ceases to be floating during the short output pulse from the flip-flop circuit BS and it goes to the potential Vprech. As soon as the end of the pulse is reached, it becomes a floating node again (apart from the inevitable leakages) because of the fact that it is connected to other circuit elements only by capacitors or by very high resistive impedances.

The floating node N is indeed connected, firstly, to the voltage Vpp by means of a capacitor C and, secondly, to an input of a comparator CMP2 (with a very high input impedance). The other input of the comparator is connected to a reference voltage which has a value Vprech-dV, where dV (directly or possibly with a factor of multiplication) represents the maximum acceptable drop in voltage on Vpp. The output of the comparator CMP2 gives the signal Sc which contributes to the preparation of the signal A mentioned with reference to FIG. 2.

The control circuit works as follows: when Vpp reaches the value Vpp0, the flip-flop circuit BS gives the pulse for the precharging of the floating node. This floating node goes to the voltage Vprech. The voltage at the terminals of the capacitor C becomes Vpp0-Vprech. When the pulse ends, the capacitor C remains charged with the voltage Vpp0-Vprech. If the voltage Vpp now changes and drops following a useful or parasitic current consumption, the floating node will follow the variations of Vpp. If Vpp goes below Vpp0dV, the voltage of the floating node will go below Vprech-dV and the comparator will give the signal Sr which will start up the load pump and the regulator again.

This explanation does not take into account the fact that there may be a relatively high parasitic capacitance between the floating node and the ground. In this case there are two solutions: either it is stipulated that the capacitance of the capacitor C will be chosen so as to be far higher than the parasitic capacitance or else the choice of the reference voltage will take account of the fact that dV no longer represents the acceptable voltage drop on Vpp except for a factor of multiplication (related to the ratio between the capacitance of the capacitor C and the parasitic capacitance). Indeed, if Vpp falls by dV, the floating node N will fall by only a fraction of dV if it is connected by a parasitic capacitor to the ground.

The control circuit CTRL consumes very little current, notably because it does not have a resistive divider or any other resistive element that is permanently connected to Vpp.

FIG. 5 shows a timing diagram of the signals in the circuit of FIG. 3. In this diagram, the appearance of the signal Sr corresponds to a negative logic transition (from 1 to 0) at the output of the comparator CMP1, and this is also so for the purpose of the signal A, which controls the transistor T1; the appearance of the signal Sc corresponds, on the contrary, to a positive transition (from 0 to 1) at output of the comparator CMP2. This is, of course, only an example.

I claim:

1. A circuit for the production of a regulated voltage Vpp comprising a load pump (PMP) having an output, a regulator circuit (REG), connected to said output of said load pump, to interrupt said load pump when said voltage Vpp exceeds a predetermined value, means (T1) operatively connected to said regulator circuit to interrupt the current consumption of said regulator circuit when said voltage Vpp exceeds said predetermined value, and a control circuit (CTRL) operatively connected to said load pump and said regulator circuit, said control circuit detecting a drop by a determined value (dV) in said voltage Vpp and generating a signal (SC) for restarting said load pump and said current consumption of said regulator circuit.

2. A circuit according to claim 1, said control circuit (CTRL) comprising a floating node (N) connected by a capacitor (C) to said voltage Vpp, means (T2) for precharging said floating node at a predetermined voltage value (Vprech), a comparator (CMP2) having an input connected to the floating node to detect a drop in voltage at the floating node to a level below a predetermined level Vprech - dV, said comparator (CMP2) generating, at its output, said signal (SC) for restarting said load pump and said current consumption of said regulator circuit.

3. A circuit according to claim 2, said control circuit further comprising means (BS) controlled by said regulator circuit to generate a short pulse from the time when said voltage Vpp exceeds said predetermined value, said short pulse being applied to the means for precharging to set up the precharging of said floating node.

4. A circuit according to claim 1, said regulator circuit comprising a resistive divider (DR), a comparator (CMP1) having an input connected to an intermediate point of said resistive divider, and a transistor (T1) which interrupts the current supply of said resistive divider, said transistor (T1) being turned off by a signal (SR) generated by said comparator (CMP1) and by said signal (SC) generated by said control circuit.

5. A circuit according to claim 4, said resistive divider comprising series connected resistors each connected by a transistor having a gate connected to a drain, each transistor being made in an individual well separated from the wells of other transistors.

6. A circuit for the production of a regulated voltage Vpp comprising a load pump (PMP) having an output, a regulator circuit (REG), connected to said output of said load pump, to interrupt said load pump when said voltage Vpp exceeds a predetermined value, means (T1) operatively connected to said regulator circuit to interrupt the current consumption of said regulator circuit when said voltage Vpp exceeds said predetermined value, and a control circuit (CTRL) operatively connected to said load pump and said regulator circuit, said control circuit detecting a drop by a determined value (dV) in said voltage Vpp and generating a signal (SC) for restarting said load pump and said current consumption of said regulator circuit, said control circuit (CTRL) comprising a floating node (N) connected by a capacitor (C) to said voltage Vpp, means (T2) for precharging said floating node at a predetermined voltage value (Vprech), a comparator (CMP2) having an input connected to the floating node to detect a drop in voltage at the floating node to a level below a predetermined level Vprech - dV, said comparator (CMP2) generating, at its output, said signal (SC) for restarting said load pump and said current consumption of said regulator circuit, said control circuit further comprising means (BS) controlled by said regulator circuit to generate a short pulse from the time when said voltage Vpp exceeds said predetermined value, said short pulse being applied to the means for precharging to set up the precharging of said floating node.

* * * * *